(12) United States Patent
Steinbach

(10) Patent No.: US 8,098,769 B2
(45) Date of Patent: Jan. 17, 2012

(54) CIRCUIT AND METHOD FOR RECOVERING A CARRIER

(75) Inventor: Ingo Steinbach, Freiburg (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 618 days.

(21) Appl. No.: 11/237,611

(22) Filed: Sep. 28, 2005

(65) Prior Publication Data

US 2006/0067431 A1 Mar. 30, 2006

(30) Foreign Application Priority Data

Sep. 28, 2004 (DE) .......................... 10 2004 047 424

(51) Int. Cl.
*H04L 27/00* (2006.01)
*H03D 3/18* (2006.01)

(52) U.S. Cl. ........................................ 375/326; 375/327

(58) Field of Classification Search .................. 375/326, 375/327, 324, 322, 316
See application file for complete search history.

(56) References Cited

U.S. PATENT DOCUMENTS

| | | | |
|---|---|---|---|
| 4,484,194 A | 11/1984 | Arvidsson | |
| 4,608,703 A | 8/1986 | Kaga et al. | |
| 4,729,110 A | 3/1988 | Welles, II et al. | |
| 4,860,018 A | 8/1989 | Counselman, III | |
| 4,871,975 A | 10/1989 | Nawata et al. | |
| 4,977,580 A | 12/1990 | McNicol | |
| 5,148,451 A | 9/1992 | Otani et al. | |
| 5,245,611 A | 9/1993 | Ling et al. | |
| 5,321,514 A | 6/1994 | Martinez | |
| 5,418,815 A | 5/1995 | Ishikawa et al. | |
| 5,507,024 A | 4/1996 | Richards, Jr. | |
| 5,572,264 A | 11/1996 | Mizukami et al. | |
| 5,604,768 A | 2/1997 | Fulton | |
| 5,636,312 A * | 6/1997 | Okamoto et al. | 386/19 |
| 5,748,262 A | 5/1998 | Boie | |
| 5,809,088 A | 9/1998 | Han | |
| 5,825,242 A | 10/1998 | Prodan et al. | |
| 5,828,705 A | 10/1998 | Kroeger et al. | |
| 5,831,689 A | 11/1998 | Boie | |
| 5,893,025 A | 4/1999 | Bessho et al. | |
| 5,956,374 A * | 9/1999 | Iwamatsu | 375/320 |

(Continued)

FOREIGN PATENT DOCUMENTS

DE 197 39 645 3/1999 ............... 7/27

(Continued)

OTHER PUBLICATIONS

J. Ammer et al., "Timing Recovery Unit for a 1.6 Mbps DSSS Receiver," [Online] Dec. 12, 2000, pp. 1-28, XP-002448107, University of Berkeley, USA, URL: http://bwrc.eecs.berkeley.edu/People/Grad_Students/msheets/ee225c/EE225c_final_ammer_sheets.pdf.

(Continued)

*Primary Examiner* — David C. Payne
*Assistant Examiner* — Brian J Stevens
(74) *Attorney, Agent, or Firm* — O'Shea Getz P.C.

(57) ABSTRACT

The invention relates to recovering a carrier for a synchronous demodulator, that receives an input signal. A carrier is reconstructed for the provided input signal, and the input signal (in) and carrier (tr) are mixed to generate a mixed signal to be outputted (i, q), wherein a residual phase error of the mixed signal is corrected by a phase shift to provide a phase corrected output signal.

4 Claims, 5 Drawing Sheets

U.S. PATENT DOCUMENTS

| | | | |
|---|---|---|---|
| 6,005,363 A * | 12/1999 | Aralis et al. | 318/560 |
| 6,028,903 A * | 2/2000 | Drost et al. | 375/360 |
| 6,075,409 A | 6/2000 | Khlat | |
| 6,133,964 A | 10/2000 | Han | |
| 6,184,921 B1 | 2/2001 | Limberg | |
| 6,233,295 B1 | 5/2001 | Wang | |
| 6,259,751 B1 | 7/2001 | Park et al. | |
| 6,304,136 B1 | 10/2001 | Rabii | |
| 6,307,898 B1 | 10/2001 | Ido | |
| 6,459,693 B1 | 10/2002 | Park et al. | |
| 6,559,899 B1 | 5/2003 | Suzuki et al. | |
| 6,614,734 B1 * | 9/2003 | Lebowsky et al. | 369/44.34 |
| 6,661,852 B1 | 12/2003 | Genrich | |
| 7,107,011 B2 | 9/2006 | Nakazawa et al. | |
| 7,133,469 B2 | 11/2006 | Kawai | |
| 7,170,945 B2 | 1/2007 | Blat | |
| 7,593,065 B2 | 9/2009 | Temerinac et al. | |
| 2002/0097812 A1 | 7/2002 | Wiss | |
| 2003/0011412 A1* | 1/2003 | Stief | 327/158 |
| 2003/0203728 A1 | 10/2003 | Filipovic | |
| 2004/0081257 A1 | 4/2004 | Lin et al. | |
| 2005/0069055 A1 | 3/2005 | Song | |
| 2005/0110540 A1* | 5/2005 | Kwak | 327/158 |
| 2005/0232376 A1 | 10/2005 | Liem | |
| 2006/0072686 A1 | 4/2006 | Steinbach et al. | |

FOREIGN PATENT DOCUMENTS

| | | | |
|---|---|---|---|
| EP | 0065150 | 11/1982 | |
| EP | 0696854 | 2/1996 | |
| EP | 0963110 | 12/1999 | 5/455 |
| EP | 1 487 166 | 12/2004 | 27/227 |
| JP | 57031235 | 2/1982 | |
| JP | 62233942 | 10/1987 | |
| JP | 06104788 | 4/1994 | |
| JP | 06112858 | 4/1994 | |
| JP | 07326980 | 12/1995 | |
| JP | 09294151 | 11/1997 | |
| JP | 2000049879 | 2/2000 | |
| JP | 2000174835 | 6/2000 | |
| JP | 2002044174 | 2/2002 | |
| JP | 2002217992 | 8/2002 | |
| JP | 3481486 | 12/2003 | |
| JP | 2004112384 | 4/2004 | |
| WO | WO 01/05025 | 1/2001 | |

OTHER PUBLICATIONS

W. Gao et al., "All-Digital Reverse Modulation Architecture Based Carrier Recovery Implementation for GMSK and Compatible FQPSK," IEEE Transactions on Broadcasting, vol. 42, No. 1, Mar. 1996, pp. 55-62, XP011006019.

Limann, "Fernsehtechnik ohne Ballast", Einführung in die Schaltungstechnik der Schwarzweiss- und Farb-Fernsehempfänger, 13th edition, 1979, Franzis-Verlag GmbH, Munich; ISBN 3-7723-5273-1; pp. 73-85.

Japanese Office Action, Apr. 13, 2010.

* cited by examiner

CIRCUIT AND METHOD FOR RECOVERING A CARRIER

PRIORITY INFORMATION

This patent application claims priority from German patent application 10 2004 047 424.9 filed Sep. 28, 2004, which is hereby incorporated by reference.

BACKGROUND OF THE INVENTION

The invention relates to the field of signal processing, and in particular to recovering a carrier for a synchronous demodulator.

In order to transmit a signal, especially through a wireless interface, the signal is modulated before transmission. Demodulation is implemented on the receiver side. In order to demodulate the signal using a synchronous demodulator, it is necessary to reconstruct the carrier signal or the carrier for the signal. The received signal is then mixed with this reconstructed carrier into the baseband using an I/Q mixer, and demodulated therewith. A phase-locked loop (PLL) is used to reconstruct the carrier in the process of carrier recovery. This loop measures the current phase difference between the received and reconstructed carrier to calculate a control correction signal for the phase therefrom, this correction signal is used to track the reconstructed signal.

The maximum speed of the phase-locked loop, the so-called PLL bandwidth, is limited by the propagation times that occur within the control loop. In control engineering, these propagation times are called dead times. They reduce the maximum possible loop gains at which the system continues to operate in a stable fashion. However, if the received signal contains components lying outside the PLL bandwidth, a residual phase error remains. This error causes a reduction in the level of demodulation, thereby causing the signal to be demodulated incorrectly.

The disadvantage is thus that error-free demodulation cannot be effected due to this residual phase error. For this reason, an appropriately improved method or circuit for recovering the carrier is proposed.

FIG. 4 is a block diagram illustrating a known synchronous demodulator. A received input signal is applied on a line 402 to an I/Q mixer 404 (I: in-phase, Q: quadrature phase). The mixer 404 uses two multipliers 406, 408 to multiply the input signal on the line 402 with a locally reconstructed picture carrier or signal carrier in the form of a carrier on a line 410, and thus mixes the input signal into the baseband. During multiplication, mixing products are created which are located at double the carrier frequency. These mixing products are undesirable and are therefore filtered out within the mixer 404 by low-pass filters 412, 414. At the output of the mixer 404, the carrier is approximately at a frequency of f≈0. What is thus output is a mixed signal i, q, with in-phase and quadrature-phase components I, Q.

Referring still to FIG. 4, the mixed signal i, q is also supplied to a PLL control loop 416. The in-phase and quadrature signal components are input to low pass filters 418, 420, respectively. To remove audio information in the case of a television signal, the filtered mixed signal is applied to a so-called COordinate Rotation DIgital Computer (CORDIC). Using a polar coordinate transformation, the CORDIC 421 determines the phase value of the I/Q signal pair at the input, and provides the phase value on a line 422. If the reconstructed carrier on the line 410 equals the received carrier of the input signal on the line 402 exactly, then the measured phase on the line 422 is equal to zero. If this is not true, the phase value on the line 422 is used to correct a digital I/Q oscillator 424. This digital oscillator LO 424 generates the carrier on the line 410 which is supplied to the mixer 404 to be mixed with input signal on the line 402. For this purpose, the phase value on the line 422 is fed by the CORDIC 421 to a control device 426 which performs the appropriate calculations and controls the oscillator 424 accordingly.

In an implementation as a digital circuit, the necessary calculations within this type of control loop, also called an All Digital PLL (ADPLL), (e.g., calculations such as those performed by a CORDIC algorithm, filtering, and calculation of a correction signal by the control device 426), produce signal delays due to the calculation time and group propagation times of the filters. These delays are often called dead times in control engineering and reduce the maximum possible loop gain and thus the speed of the control loop. If in this case an excessively high loop gain is selected, the control loop becomes unstable. To characterize the speed of an ADPLL, the PLL-bandwidth is used which is obtained from the system transfer function. This indicates which frequency changes can still be compensated.

FIG. 5 illustrates the simulation of a signal in which the picture carrier contains unwanted frequency modulation. The frequency of the picture carrier here changes very quickly as soon as the amplitude changes. Since in this circuit the carrier recovery is not able to react quickly enough, the frequency change manifests itself as a rotation, meaning that the phase error becomes increasingly larger until the amplitude, and thus the frequency, change back to the original state.

FIG. 6 shows that the actual outputted demodulated signal demonstrates a response which clearly deviates from the ideal response. The signal example here is a video signal having a black picture content. The horizontal synchronization pulses of an ideal signal would be rectangular and free of high-frequency noise components. The simulated demodulated signal, on the other hand, reveals a high noise component and oblique edges with strong high-frequency oscillation components. For a connected television set, these distortions of the synchronization pulses mean that the horizontal alignment of the scanning lines cannot be precisely determined—with the resulting distorted picture contents.

There is a need for improved recovery of a carrier which takes into account the residual phase error.

SUMMARY OF THE INVENTION

In a synchronous demodulator that receives an input signal, a carrier is reconstructed for the provided input signal, and the input signal and the carrier are mixed in order to generate a mixed signal, wherein in order to provide an output signal a residual phase error of the mixed signal is corrected by a phase shift.

The mixer mixes the input signal with the carrier, and the resultant mixed signal is input to a phase-locked loop to determine a control correction signal to control the carrier. The circuit includes a phase shifter to correct a residual phase error of the mixed signal, for the purpose of providing an output signal.

The residual phase error is used to augment recovery of the carrier such that demodulation can be implemented without disturbance even in the case of signal changes outside the PLL bandwidth, or at least be implemented in a significantly improved manner.

The residual phase error within a control loop is determined in order to measure the phase of the mixed signal and to determine a control correction signal to control the carrier.

The residual phase error may be determined within the control loop, then employed for the phase shift following the control loop in the form of a supplemental phase shift.

The mixed signal may be delayed before the phase shift based on the propagation times in the control loop.

In the event of a control action during reconstruction of the carrier a phase error value is interpolated before application of the phase shift to the sampling rate employed.

The parameters for the low-pass filtering of the residual phase error may be defined based on a compromise between the sensitivity and control bandwidth of a control action during reconstruction of the carrier.

The phase-locked loop is designed and/or controlled to determine the residual phase error and to provide a correction signal for the phase shifter.

The phase shifter may be located following a control tap of the mixed signal for the phase-locked loop.

A delay device may be connected on the input side of the phase shifter to delay the mixed signal before the phase shifter.

An interpolation device may be located before the phase shifter to interpolate a phase error value or a correction value for an employed sampling rate in the event of undersampling within the phase-locked loop.

A low-pass filter may filter the residual phase error, a phase error value to provide a correction signal, wherein the parameters of the low-pass filter are defined by a control device in the form of a compromise between sensitivity and control bandwidth.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
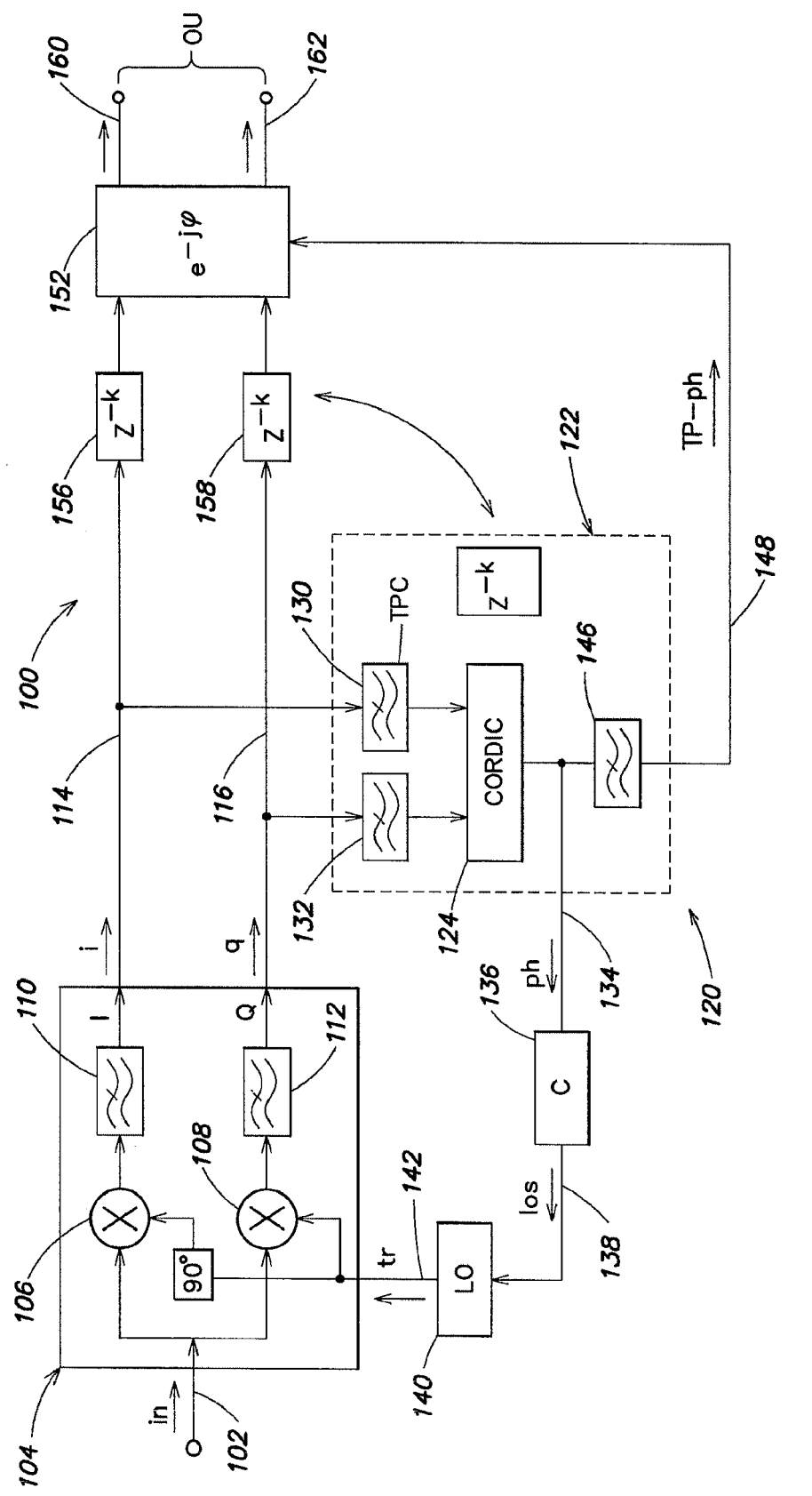
FIG. 1 illustrates a circuit for recovering a carrier taking into account a residual phase error.

FIG. 1 illustrates a circuit 100 to effect carrier recovery of a reconstructed carrier for an input signal in, specifically, a television signal input on a line 102. The individual components described may be designed as individual and separate structural elements. Implementation is also possible in the form of an integrated circuit or software in a processor, to the extent this is feasible for the individual components.

The input signal on the line 102 is input to a mixer 104, which includes multipliers 106, 108 that generate in-phase and quadrature signal components, respectively. The in-phase and quadrature signal components are filtered by low-pass filters 110, 112, respectively and the resultant I and Q signal components are output on lines 114, 116, respectively. At each of the two second inputs of the multipliers 106, 108, a carrier signal tr is applied in the known manner such that after multiplication of the input signal by the carrier signal an in-phase and a quadrature-phase signal are outputted at the respective outputs of multipliers.

The I, Q signal components on lines 114, 116 are input to a phase-locked loop (PLL) 120 and to a first processing unit 122 with a CORDIC 124. At the same time, the two components of the mixed signal i, q are fed to low-pass filters 130, 132 if, for example, in the case of a television signal audio information must be removed. The output signals of the two low-pass filters 130, 132 are then fed to the CORDIC 124 for processing. Since the phase value of the I/Q signal pair determined by the CORDIC 124 at its input is important in terms of later considerations, for the sake of simplification this value is shown only in FIG. 1 and then taken into account subsequently. Also for the sake of simplification, additional signals as well as components normally found within such a circuit are not considered and should be added as dictated by common technical knowledge.

The signal output on the line 134 by the CORDIC 124 is fed along with the specific instantaneous phase value to a control device 136 which generates and provides a control correction signal on a line 138 to a local oscillator 140. The local oscillator 140 utilizes the control correction signal to adjust the carrier signal on the line 142 which is generated by the local oscillator 140 and is fed to the mixers for multiplication with input signal on the line 102.

The signal on the line 134 with phase value ph, which is determined and outputted by the CORDIC 124, is fed to a low-pass filter 146, which provides a correction signal on a line 148 to re-adjust the carrier. This correction signal on the line 148 is fed as a control signal to a phase shifter 152. Since a propagation time delay $z^{-k}$ is caused by the control loop, delay devices 154, 156 delay the mixed signal i, q respectively by a corresponding value $z^{-k}$. The output signal or its components from the delay devices 156, 158 are fed to the two inputs of the phase shifter 152. Using the applied correction signal on the line 138, the phase shifter 152 provides for a correction of the residual phase error of the mixed signal i, q, and outputs in-phase and quadrature corrected signals on lines 160, 162, respectively. Depending on the design, the phase shifter 152 can also be designed based on independent components for the two signal components i, q of the mixed signal.

Figure 3:
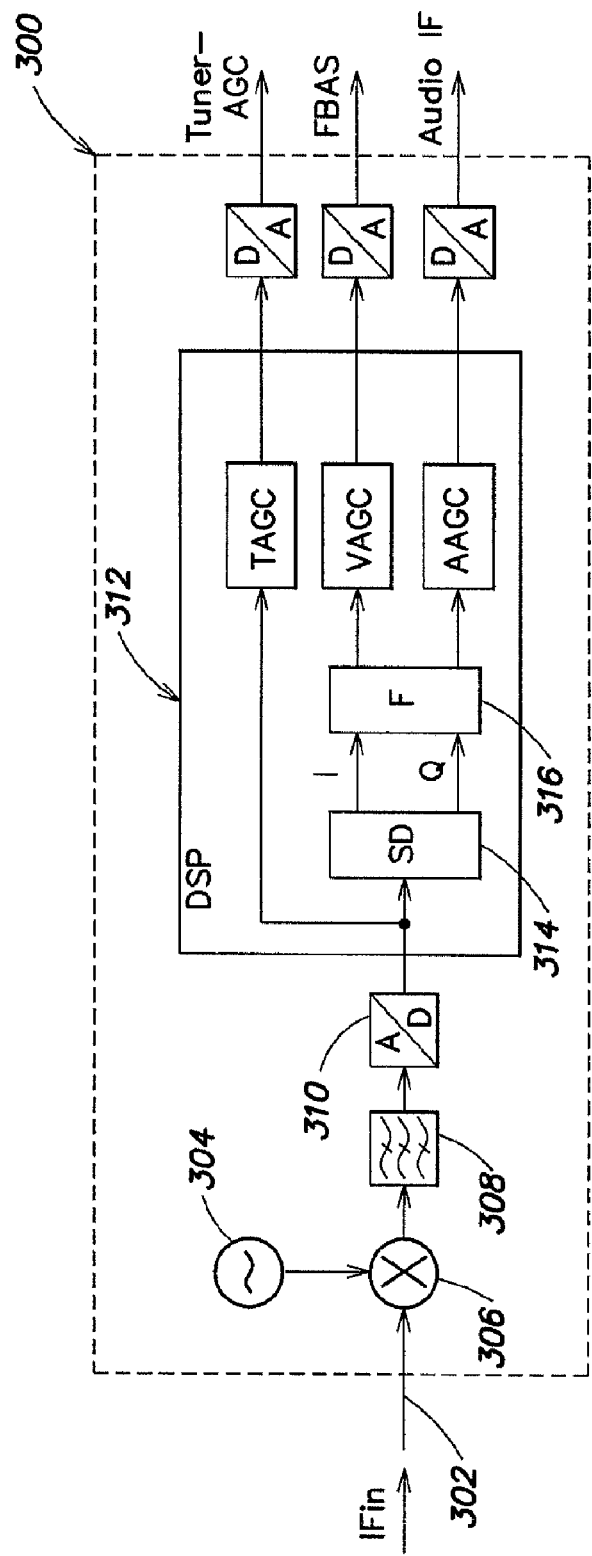
FIG. 3 is a block diagram illustration of a digitally implemented television receiver with this type of circuit.
Figure 4:
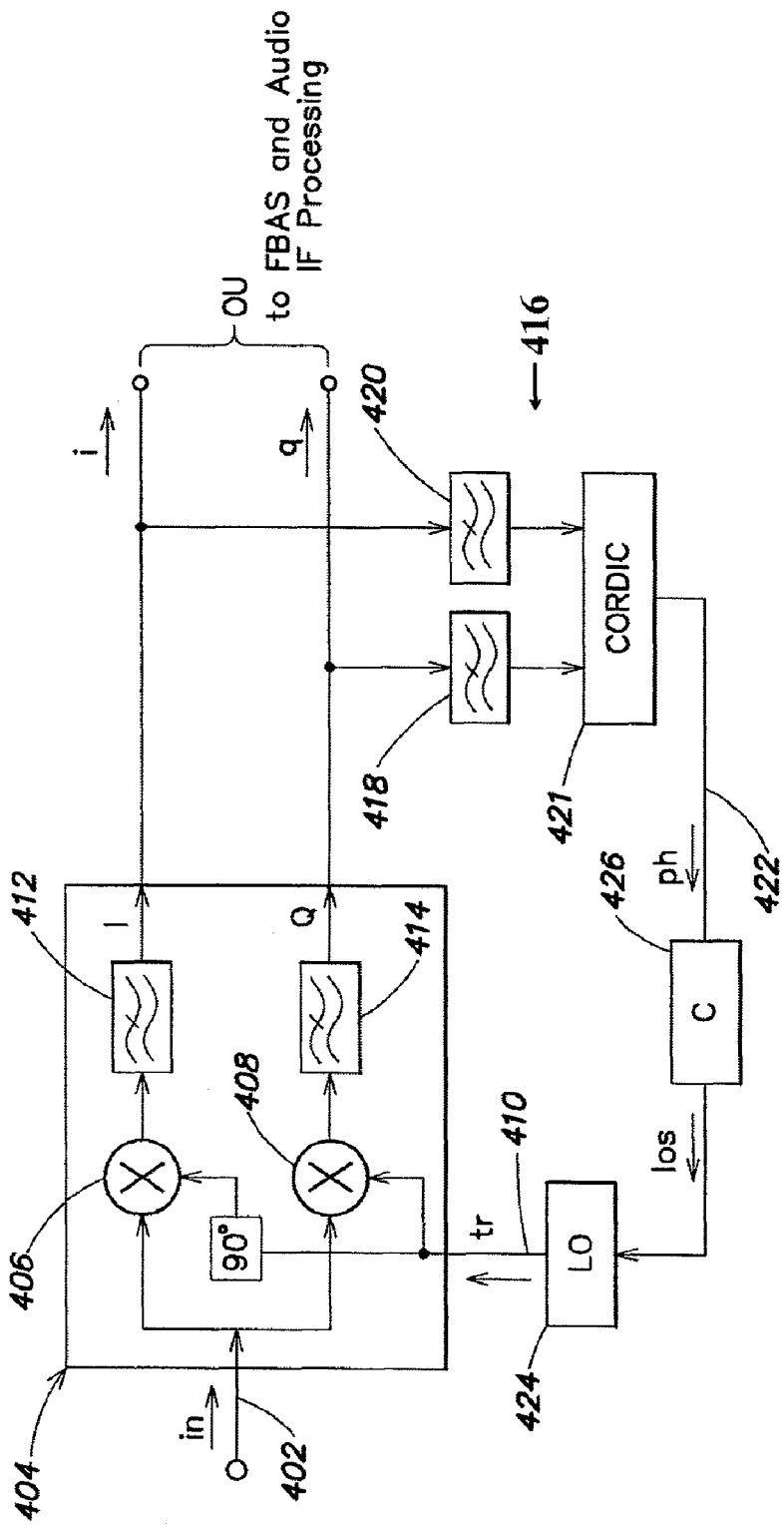
FIG. 4 is a block diagram illustration of a prior art synchronous demodulator for recovering a carrier.
Figure 5:
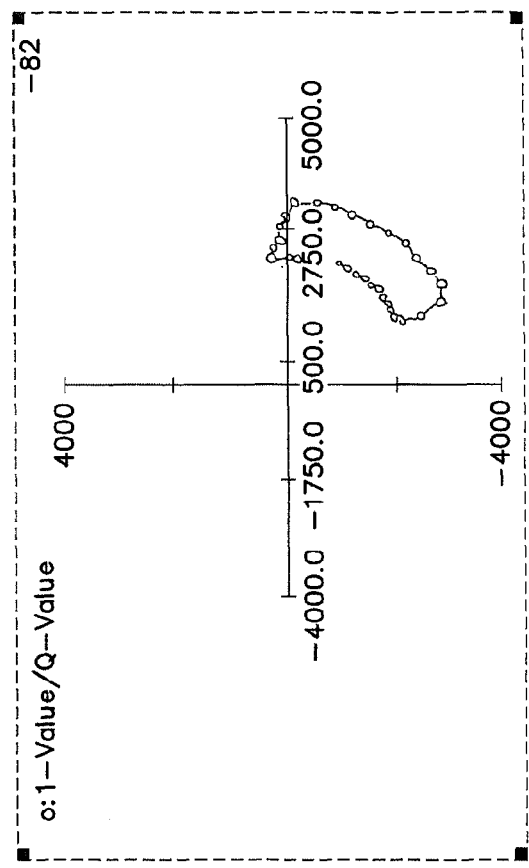
FIG. 5 is a baseband graph for a frequency-modulated television signal of a prior art synchronous demodulator.
Figure 6:
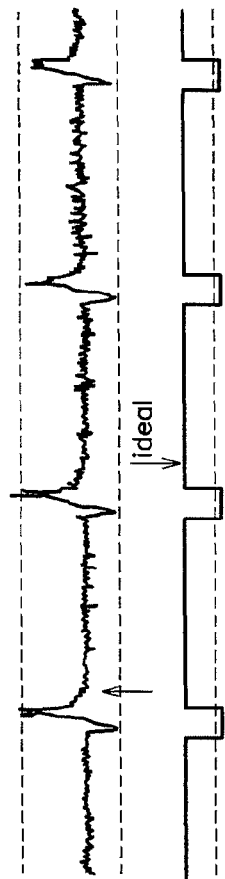
FIG. 6 is a graph of a demodulated video signal for a frequency-modulated picture carrier and slow recovery of the carrier based on prior art.

FIG. 3 is a block diagram of a digitally implemented television receiver 300 in which a carrier recovery circuit of the present invention can be implemented. A received television signal IFin on a line 302 is converted by a local oscillator 304 and mixer 306 to a second intermediate frequency. After bandpass filtering in a bandpass filter 308, unwanted mixing products are removed from the signal which can then be digitized without aliasing in an analog-to-digital converter A/D 310. The resultant digitized signal is input to a digital signal processor (DSP) 312, and mixed by a synchronous demodulator 314 into the baseband. By additional filtering in another filter 316 and additional algorithms, a video signal and audio intermediate-frequency signal are obtained from the I, Q signals, outputted from the synchronous demodulator 314. Using an automatic gain control (AGC) tuner, a tuner output level is adjusted so that the analog-to-digital converter A/D 310 is not overloaded. On the output side and using various known components VAGC (video AGC) and AAGC (audio AGC), signals to be outputted are modulated in an optimum manner for the corresponding digital-to-analog converters. The digital-to-analog converters output corresponding known signals tuner-AGC, FBAS (composite color video signal) or audio-IF (audio intermediate frequency) to additional components of a television receiver.

In this embodiment of a digitally implemented television receiver, the circuit of FIG. 1 can be advantageously employed as the synchronous demodulator 314. The synchronous demodulator of FIG. 1 can also be advantageously employed in other receiver systems. The theoretical principles for reception of analog television signals are shown merely as an exemplary description. The input signal at the analog-to-digital converter using the example of an analog television is produced according to the equation:

$$u(t) = \hat{u}_{BT} \cos(2\pi f_{BT}(t) \cdot t) \cdot (1 + m \cdot U_{Bild}(t)) + \hat{u}_{TT} \cos(2\pi f_{TT} \cdot t + \Delta\phi_{TT} \cdot U_{Ton}(t)), \quad (1)$$

the first term corresponding to a picture AM modulation and the second term corresponding to an audio FM modulation where $\hat{u}_{BT}$ is the picture carrier amplitude, m is the modulation index, $U_{Bild}(t)$ is the picture information, $f_{BT}(t)$ is the picture carrier frequency, $\hat{u}_{TT}$ is the audio carrier amplitude, $f_{TT}$ is the audio carrier frequency, $\Delta\phi_{TT}$ is the phase deviation of the FM modulation, and $U_{Ton}(t)$ is audio information.

The audio carrier is removed by filtering, and the signal model relevant for carrier recovery is obtained according to the equation:

$$u(t) = \hat{u}_{BT} \cos(2\pi f_{BT}(t) \cdot t) \cdot (1 + m \cdot U_{Bild}(t)) \quad (2)$$

as picture AM-modulation.

As is evident from equation (2), the picture carrier frequency is altered as a function of time. It can change in a purely random fashion, for example as a result of phase jitter from the transmitter, or as a function of the amplitude of the video signal in the form of additional frequency modulation.

The known carrier recovery loop is augmented, as shown in FIG. 1, by a forward supervision that corrects the residual phase error via the phase shifter 152 (FIG. 1) in the actual signal path following the mixer 104 and following the tap for the control loop. Here the delay devices 156, 158 are used to adjust the system delay $z^{-k}$ of the filtering and phase measurement in the signal path so that the appropriate phase error is simultaneously applied for each I/Q value pair of mixed signal i, q at the input of the phase shifter 152.

The phase shifter 152 can be implemented, for example, by employing the known CORDIC algorithm. Implementation of the phase shifter 152 is also feasible using complex multiplication that can be executed according to the equations $$\begin{aligned} I_{rot} + jQ_{rot} &= (I_{in} + jQ_{in}) \cdot e^{-j\varphi} \quad (3) \\ &= (I_{in} + jQ_{in}) \cdot (\cos\varphi - j\sin\varphi) \\ &= (I\cos\varphi + Q\sin\varphi) + j(Q\cos\varphi - I\sin\varphi) \end{aligned}$$

The correction signal TP-ph on the line 148 for the phase shifter 152 is generated, as described above, from the phase value ph on the line 134 by the low-pass filter 146 in the forward correction path, this value being output by the CORDIC 124. Using this low-pass filter 146, it is possible to adjust the bandwidth of the error correction. This property is advantageous, for example, in allowing the broadband phase jitter of the transmitting oscillator to be excluded from the correction.

In order to save computational effort, the loop of the control loop is often set to a lower sampling rate. In this case, the other low-pass filter 146 can be designed to have either an additional or alternative function as an interpolation filter to recover the original sampling rate.

Figure 2A:
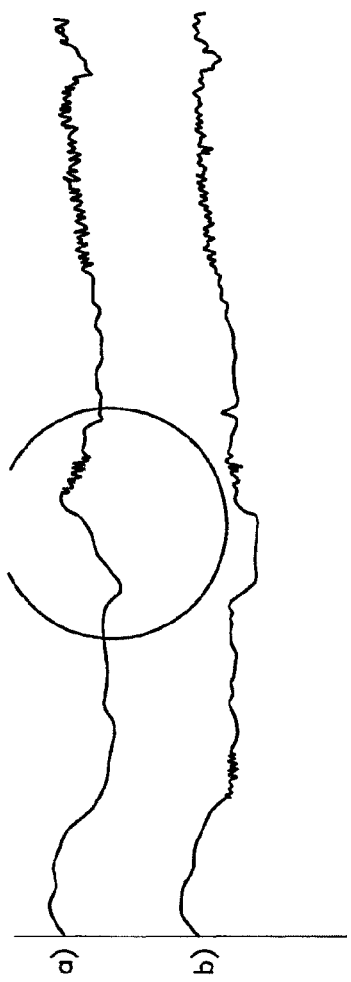
FIGS. 2A and 2B show simulation results which illustrate curves for a pure PLL as compared with a PLL with correction of the residual phase error.
Figure 2B:
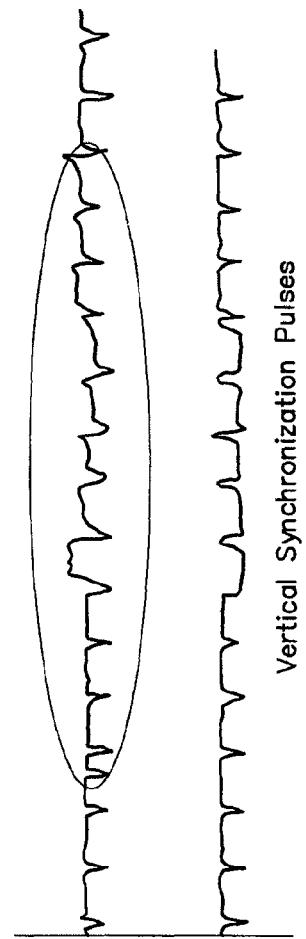

FIGS. 2A and 2B show simulation results for a simulation of the entire system. The example here graphs a demodulated television signal, specifically, an FBAS signal, based on a simple implementation of the control loop (PLL), as a first signal a relative to a second signal b with an additional correction of the residual phase error. The graph here emphasizes the horizontal synchronization pulses or vertical synchronization pulses which without utilization of the forward correction as first signals a both exhibit significant distortions, with the result that a connected television set is not able to generate a stable picture from the signal. After activation of the forward correction, the juxtaposed second signals b exhibit correctly demodulated synchronization pulses.

Although the present invention has been illustrated and described with respect to several preferred embodiments thereof, various changes, omissions and additions to the form and detail thereof, may be made therein, without departing from the spirit and scope of the invention.

What is claimed is:

1. A method for recovering a carrier for a synchronous demodulator, comprising:

mixing an input signal and a carrier signal in order to generate a mixed signal that includes in-phase and quadrature signal components;

phase detecting the in-phase and quadrature signal components to provide a control signal indicative of a phase difference signal value;

generating the carrier signal in response to the control signal;

filtering the control signal to provide a filtered control signal; and time delaying the mixed signal by a time value indicative of a propagation delay associated with the steps of phase detecting and filtering to provide a time delayed mixed signal;

interpolating the filtered control signal for an employed sampling rate before application of a phase correction where there is a control action during reconstruction of the carrier signal; and phase correcting the time delayed mixed signal utilizing the filtered control signal to correct a residual phase error of the mixed signal and provide a phase corrected mixed signal;

where the mixing, the phase detecting, the generating, the time delaying and the phase correcting are performed by a signal processing device.

2. The method of claim 1, where the step of filtering comprising low pass filtering the control signal to provide the filtered control signal.

3. A circuit to effect carrier recovery of a reconstructed carrier for an input signal, comprising:

a mixer to mix the input signal with the carrier to provide a mixed signal that includes in-phase and quadrature signal components;

a phase detector that is responsive to the in-phase and quadrature signal components to provide a control signal indicative of a phase difference signal value;

an oscillator that generates the carrier signal in response to the control signal;

a filter that filters the control signal to provide a filtered control signal;

a time delay that time delays the mixed signal by a time value indicative of a propagation delay associated with the phase detector and the filter to provide a time delayed mixed signal;

a phase shifter that phase shifts the time delayed mixed signal in response to the filtered control signal to provide a phase corrected output signal; and
an interpolation device before the phase shifter to interpolate the filtered control signal for an employed sampling rate in the event of undersampling.

4. The circuit of claim 3, where the filter comprising a low-pass filter, wherein the parameters of the low-pass filter are defined by a control device as a compromise between sensitivity and control bandwidth.

* * * * *